United States Patent [19]
Smith et al.

[11] Patent Number: 5,136,169
[45] Date of Patent: Aug. 4, 1992

[54] ENERGY BEAM LOCATING

[75] Inventors: Henry I. Smith, Sudbury, Mass.; Erik H. Anderson, Lake Pekskill, N.Y.; Mark L. Schattenburg, Somerville, Mass.

[73] Assignee: Massachusetts Institute of Technology, Cambridge, Mass.

[21] Appl. No.: 681,580

[22] Filed: Apr. 5, 1991

[51] Int. Cl.⁵ ......................................... H01J 37/304
[52] U.S. Cl. .............................. 250/491.1; 250/492.2
[58] Field of Search .......... 250/491.1, 492.1, 492.2 R, 250/397, 398, 305; 378/20, 35

[56] References Cited

U.S. PATENT DOCUMENTS

| | | |
|---|---|---|
| 4,327,292 | 4/1982 | Wang et al. ........................ 250/491.1 |
| 4,413,186 | 11/1983 | Uema ................................ 250/491.1 |
| 4,443,703 | 4/1984 | Shimazu et al. ................... 250/491.1 |
| 4,443,704 | 4/1984 | Yamashita et al. ................. 250/491.1 |
| 4,467,211 | 8/1984 | Smith et al. ....................... 250/491.1 |
| 4,827,138 | 5/1989 | Randall ........................... 250/492.2 R |
| 4,890,309 | 12/1989 | Smith et al. ............................. 378/35 |
| 4,977,328 | 12/1990 | Van Vucht ........................ 250/491.1 |

Primary Examiner—Jack I. Berman
Assistant Examiner—Kiet T. Nguyen
Attorney, Agent, or Firm—Fish & Richardson

[57] ABSTRACT

A method of monitoring the travel of a beam of energy on a substrate having a fiducial pattern rigidly fixed relative to the substrate, the pattern embracing an area where the beam can create a useful image with submicron precision. The method includes: adjusting the beam such that the dose delivered by the beam is sufficiently high to generate a signal produced by the interaction of the beam and the fiducial pattern, the signal being representative of the relative position of the fiducial pattern and the travel, the dose being sufficiently low so that the area of the substrate over which the beam passes remains receptive to subsequent creation, with submicron precision, of a useful image; moving the beam across the substrate; detecting the signal produced by the interaction of the beam with the fiducial pattern; and comparing the detected signal with a predetermined signal to provide a position signal representative of the beam travel with submicron precision.

50 Claims, 5 Drawing Sheets

GOLD LINES

SCAN LINES
OF E-BEAM

GOLD LINES

SCAN LINES
OF E-BEAM

GOLD LINES

SCAN LINES
OF E-BEAM

CRT DISPLAY
(DARK)

CRT DISPLAY
(BRIGHT)

CRT DISPLAY
(MOIRE FRINGES)

SCAN RASTER CENTERED ON
GLOBAL FIDUCIAL GRID

SCAN RASTER SHIFTED TO
THE LEFT BY P/8

SCAN LINES 1 TO 7

ENERGY BEAM LOCATING

Funding for the work described herein was provided by the federal government, which has certain rights in the invention.

BACKGROUND OF THE INVENTION

The invention relates to the determination of the position of the intersection of a beam of energy with a substrate.

Electron beam lithography (EBL) uses an electron beam to write patterns, e.g. mask patterns, in electron sensitive films on substrates. An electron beam can be focused to a diameter of less than 10 nm, allowing patterns of extremely fine dimensions to be written. As a result, EBL is used widely in industry for making photomasks and x-ray lithography masks, and in research for creating fine lines on a wide variety of substrates. The primary applications of EBL in the electronics industry include the production of photomasks with minimum feature sizes of 0.5 micrometers and larger, and the creation of "discretionary wiring" in integrated circuits.

X-ray mask making is an example of a task which requires extremely precise beam control. The need for precision arises in part because an x-ray mask (unlike most photomasks) is made at 1 to 1 scale, i.e., the pattern on the mask is of the same scale as is the pattern on the substrate. The features on photomasks (when used as reticles in photoreduction schemes) are scaled up, generally 5 to 10 times larger than features on the final substrate.

A major difficulty in the application of EBL to x-ray mask production (or, for that matter, the production of any 1-to 1-mask) lies in attaining precise placement of EBL-written features on the substrate. Precise feature placement is critical e.g., in achieving correct pattern "overlay". An integrated circuit generally requires the use of several different masking layers in successive stages of its fabrication. The patterns on these various layers must superimpose or "overlay" on top of one another to within a small faction (e.g., 0.1 to 0.3) of the minimum feature size. Consider, for example, the problem of fabricating an integrated circuit of 0.3 micrometers (300 nm) minimum feature size using x-ray lithography. If the minimum features on the mask are to be 300 nm wide, each of the features on the mask must be positioned in their assigned positions in X and Y to within a small fraction of 300 nm (e.g., to within 30 to 100 nm). If such precise positioning is not achieved, the patterns on the masking layers will not overlay. This precise positioning of all the parts of a pattern must be maintained over the entire area of the mask. Thus, a mask 3×3 cm in size might typically generate a positioning requirement of 30 nm out of 3 cm, or 1 part per million.

Precise positioning in X and Y of all parts of an EBL-generated pattern is difficult. The fundamental basis for this difficulty is best understood in the context of modern EBL metrology. The three most common approaches to writing in EBL are referred to as "raster-scan", "vector-scan", and "shaped-beam". In raster-scan methods (raster scanning involves side to side scanning similar to the scanning of a TV screen) an electron beam is scanned back and forth across the surface of the substrate. The beam is turned on and off at appropriate times to create the desired pattern in the electron sensitive layer. In order to minimize aberrations, distortion, and defocus of the electron beam, the length of the scan distance on the substrate surface is limited to about 200 micrometers. To create patterns over larger areas the stage holding the sample is moved, either continuously or in discrete steps. In this way, all areas of the sample can be brought into position to be written on by the beam. The stage position is generally monitored by a laser interferometer, which can measure stage position to less than 10 nm. If the stage is not precisely where it should be, a correction signal can be sent to the controls which scan the electron beam, and the beam can be appropriately deflected to compensate for stage position error.

A vector-scan EBL system operates in much the same way except that the beam is deflected only to positions at which pattern elements are to be written. The individual pattern elements are often written in raster fashion. During writing the stage is generally stationary, and writing takes place over only a limited field, typically square in shape, which contains the pattern elements. The maximum size of the field is usually about 10,000 times the beam diameter. Thus, for a beam 100 nm in diameter, the field might be 1×1 mm; for a beam 10 nm in diameter, the field might be 100×100 micrometers. Once the writing of the field is completed, the stage is moved to a new location, and another field written. As in raster-scan methods, stage position errors can be detected by the laser interferometer and corrected by appropriate deflection of the electron beam.

A shaped-beam EBL system also generally writes with the stage stationary. Instead of raster writing each pattern element, an entire shape (e.g., a square, a rectangle or other simple geometric figure) can be projected onto the substrate. For this reason shaped-beam EBL systems can usually perform a given task much more quickly than can vector-scan or raster-scan systems. The projected shape can also be scanned by means of appropriate deflection systems.

A fundamental problem common to the EBL systems described above arises from the way in which the position of the beam, relative to the substrate, is determined. In these systems the actual location of the electron beam on the sample, at any given instant, is not known unless the beam is caused to strike one or more fiducial marks on the sample. Fiducial marks are not always placed on samples prior to EBL. In those cases when they are, they are generally located outside the areas designated for writing. Fiducial marks are frequently used in EBL to position the beam at the start of a run, to adjust the orthogonality of scans in the X and Y directions, and to adjust the magnification scale in X and Y. Calibration relative to fiducial marks is typically performed under computer control.

Once the stage is moved so that the beam is no longer sampling the fiducial marks, all further positioning of the beam and the stage is done by "dead reckoning", with a laser interferometer monitoring only the stage position. The EBL systems discussed above do not directly detect the electron beam position once the stage is moved away from the fiducial marks. Thus, until the beam can be returned to the fiducial marks for recalibration, it is assumed that the beam does not undergo any spurious deflection and that beam deflection calibration is stable.

The use of dead reckoning to determine the position of the beam suffers from a number of intrinsic flaws. These flaws can lead to pattern placement errors on x-ray masks and other substrates. Some of the flaws arise from undesired stage movement, e.g., from pitch, roll, or yaw, which may accompany movement of the stage in X and Y. Error can also be introduced when the sample surface is not precisely coplanar with the laser interferometer beams that impinge on the stage mirrors. Moreover, the X and Y axes of the stage are not necessarily parallel with the X and Y axes of beam deflection, and the substrate surface plane is not necessarily orthogonal to the electron beam axis at all field locations. Lastly, there is always some drift or shifting of the electron beam scan field due to changes in temperature, residual magnetism in the stage, eddy currents, or electrostatic charging of the sample or other surfaces in the system. It is probably impossible to anticipate and correct for all sources of drift. Depending on the magnitude of the unpredictable drift, the dead reckoning approach is, at some minimum feature size, incapable of ensuring adequate overlay.

SUMMARY OF THE INVENTION

In general, the invention features a method of monitoring the travel of a beam, preferably a scannable beam, of energy e.g., an electron beam, an ion beam, or a photon beam, on a substrate having a fiducial pattern, e.g., a grid, rigidly fixed relative to the substrate, the fiducial pattern embracing an area where the beam can create a useful image with submicron precision. The method includes: adjusting the beam such that the dose delivered by the beam is sufficiently high to generate a signal produced by the interaction of the beam and the fiducial pattern, the signal being representative of the relative position, and preferably of the relative orientation, of the fiducial pattern and the travel, the dose being sufficiently low so that the area of the substrate over which the beam passes remains receptive to subsequent creation, with submicron precision, of a useful image; moving the beam across the substrate; detecting the signal e.g., photons, or electrons, e.g., secondary electrons, produced by the interaction of the beam with the fiducial pattern; and comparing the detected signal with a predetermined signal e.g., a reference signal, e.g., a periodic or quasiperiodic signal, to provide a position signal representative of the beam travel with submicron precision e.g., a signal representative of $\Theta$, $\phi$, $M_y$, $M_x$, $X_0$, $X_1$, $Y_0$, or $Y_1$, as defined below.

In specific embodiments the method further includes creating the useful image with the beam; the useful image includes a submicron feature; and the useful image is created with submicron precision.

In other specific embodiments the comparison occurs prior to creating a first useful image representative of areas of impingement of the beam on the substrate; the comparison occurs after creating a first useful image representative of areas of impingement of the beam on the substrate; and the comparison occurs after creating a first useful image representative of areas of impingement of the beam and before creating a second useful image representative of areas of impingement of the beam.

In yet other specific embodiments the method further includes the step of controlling the travel of the beam of energy on the substrate in response to the position signal; the controlling occurs prior to creating a first useful image representative of areas of impingement of the beam on the substrate; the controlling occurs after creating a first useful image representative of areas of impingement of the beam on the substrate; and the controlling occurs after creating a first useful image representative of areas of impingement of the beam and prior to creating a second useful image representative of areas of impingement of the beam.

In yet other embodiments the method further includes the step of holographically producing the fiducial pattern.

In yet other specific embodiments the beam includes an electron beam and the substrate includes an electron sensitive layer; and the beam includes an ion beam and the substrate includes an ion sensitive layer.

In another aspect, the invention features a method of monitoring the travel of a beam, preferably a scannable beam, of energy, e.g., an electron beam, an ion beam, or a photon beam, on a substrate having a fiducial pattern, e.g., a grid, rigidly fixed relative to the substrate, the pattern embracing an area where the beam can write a useful image with submicron precision. The method includes: moving the beam across the substrate to create the useful image; detecting a signal e.g., photons, or electrons, e.g., secondary electrons, produced by the interaction of the beam with the fiducial pattern while the beam is creating the useful image, the signal being representative of the relative position, and preferably of the relative orientation, of the fiducial pattern and the travel; and comparing, preferably while the beam is creating the useful image, the detected signal with a predetermined signal, e.g., a reference signal, e.g., a periodic or a quasiperiodic signal, to provide a position signal representative of the beam travel with submicron precision, e.g., a signal representative of $\Theta$, $\phi$, $M_y$, $M_x$, $X_0$, $X_0$, $x_1$, $Y_0$, or $Y_1$, as defined below.

In specific embodiments the useful image includes a submicron feature; and the useful image is created with submicron precision.

In other specific embodiments the method further includes the step of controlling the travel of the beam of energy on the substrate in response to the position signal; and the controlling is performed while the beam is writing the useful image.

In yet other specific embodiments the method further includes the step of holographically producing the fiducial pattern.

In another aspect, the invention features a substrate for establishing a useful image representative of the path traversed by a beam of energy in a region of the substrate. The substrate is responsive to impingement of the beam of energy and includes a fiducial pattern, e.g., a grid, which is fixed with reference to the region of the substrate used for the creation of a useful image. The fiducial pattern is located in the region of the substrate where the useful image is created; it includes indices representative of beam travel; and it is characterized by producing a detectable signal representative of the travel of the beam on the substrate with submicron precision.

In specific embodiments the fiducial pattern embraces a portion of the substrate that lies between a first region of the substrate in which a useful image is to be established and a second region of the substrate in which a useful image is to be established; the substrate includes a film sensitive to the impingement of an electron-beam; the substrate includes a film sensitive to the impingement of a photon-beam; the substrate includes a film sensitive to the impingement of an ion-beam; and the indices are distributed in a regular array.

A useful image, as used herein, is an image created by a beam which delivers a dose which is above a predetermined threshold. The substrate can be exposed to a beam which delivers a dose which is below the threshold to provide information on the relative position and/or relative orientation of the fiducial pattern and beam travel without creating a useful image.

Travel of a beam, as used herein, embraces both the position of the beam and the spatial location and orientation of a scan field.

A scan field, as used herein, is a region over which an energy beam can be scanned and within which patterns can be created by the beam.

Magnification scale, as used herein, is the ratio of the beam deflection distance on the sample or substrate to the corresponding range of signal applied to a deflection device. $M_x$, as used herein, is the magnification in the X direction, and $M_y$, as used herein, is the magnification in the Y direction in rectangular coordinates. $\phi$, as used herein, represents the orthogonality of the X and Y axes of beam scan.

$\Theta$, as used herein, represents the angular rotation of the X, Y axes of the scan field relative to the X, Y axes of the fiducial pattern.

$X_0$, $Y_0$, as used herein, refers to a first or initial position of a beam or a scan field on a substrate.

$X_1$, $Y_1$, as used herein, refers to a second or subsequent position of a beam or a scan field on a substrate.

A beam, as used herein, is a beam of energy, for example an electron-, an ion-, or a photon beam, including an X-ray beam.

A fiducial pattern, as used herein, is a two-dimensional array of fiducial marks. Preferably the marks cover, i.e., they overlap, a portion of the substrate on which features will be written by a beam.

A beam-sensitive material or layer, as used herein, is a material, or a layer of such material, which undergoes a change upon exposure to a beam of energy. Preferably, the change is one that allows a pattern or feature to be developed in or on the sensitive material.

A feature, or image, as used herein, can be any pattern or pattern element described, or written, by a beam on the surface of a substrate. Preferably the feature or image is submicron in size or contains an element that is submicron in size.

A quasiperiodic signal, as used here, means a signal the periodicity of which is determined by a non-random mathematical function.

A periodic signal, as used herein, means a regularly occurring signal.

Methods of the invention employ a fiducial pattern, i.e., an array of fiducial marks, distributed over the portion of the substrate upon which features are written by a beam of energy. Signals generated by the intersection of the beam with the fiducial marks can be sampled while the beam is in position to write and allowing determination and/or correction of beam position in real time. By providing fiducial marks at all scan field locations, methods of the invention allow adjustments such as X and Y magnification scale, X and Y position, and X and Y orthogonality to be made at each field location, either prior to, or during the writing of the field. Because the beam position can be directly determined, even over the portion of the substrate where a feature is to be written, many of the errors which accompany "dead reckoning" of beam position are reduced or eliminated.

In some methods of the invention the fiducial patterns are produced by holographic technology and thus are of exceptionally high dimensional integrity and provide long range pattern coherence.

Other features, objects, and advantages will become apparent from the following detailed description when read in connection with the accompanying drawings.

DETAILED DESCRIPTION

Figure 1:
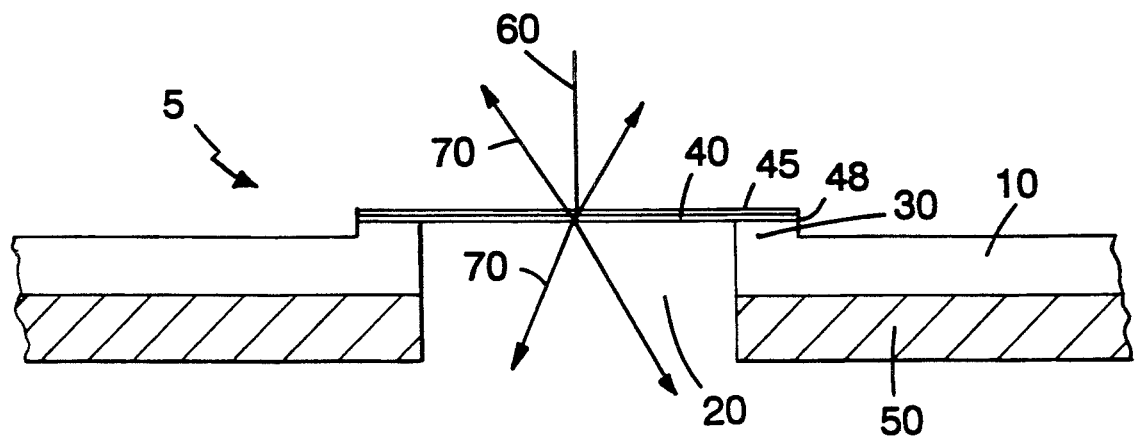
FIG. 1 is a cross-sectional view of a mask membrane.

With reference to FIG. lithography assembly 5 includes a Si wafer substrate 10 which has been etched to provide an open hole 20 and a raised rim 30. Free-standing membrane composite 40 is suspended across hole 20. The membrane composite 40 is preferably under tensile stress to ensure flatness and preferably has sufficient mechanical strength so that it can be handled and processed without breakage. The membrane composite 40 includes a layer of electron sensitive material 45 and a membrane 48 and is suitable for making e.g., an X-ray mask. Membranes 48 of Si single crystal, $Si_3N_4$, and SiC, have all been used successfully. Diamond can also be used. With $Si_3N_4$ as the membrane material, a flatness of less that 500 nm is easily achieved over a 2.5 cm diameter. The Si wafer is bonded to an optically flat Pyrex ring 50. This bonding is typically done by electrostatic means (so-called anodic bonding) prior to etching of the Si substrate to leave the free-standing membrane.

An electron beam 60, is shown passing through the membrane composite 40. When the beam enters the membrane composite 40, secondary and backscattered electrons 70, are emitted from the front side. When the beam exits, the beam diameter is broadened somewhat, and secondary and scattered electrons 70 are again emitted. The electron beam 60 can be scanned across the membrane composite 40, either for the purpose of pattern writing (EBL), or for sensing a fiducial pattern on the membrane. The electron beam 60 is depicted as having negligible width. In reality it will have some finite width and, in the case of a shaped-beam EBL system, the beam cross section can be, e.g., a square, a rectangle, or some other geometric shape.

FIG. 2 shows cross-sectional views of various configurations of mask membrane composites in greater detail. The mask membrane composite 10 depicted in FIG. 2A includes a membrane 20, e.g., a Si single crystal, $Si_3N_4$, or SiC membrane, a gold plating base 30 about 10 to 30 nm thick, an electron sensitive resist film 40, and, on the back side of the membrane 20, a fiducial grid 50. FIG. 2B shows a cross-sectional view of a similar membrane composite 10, but wherein the fiducial grid 50 is on top of a tungsten or tantalum absorber layer 60, which in turn is covered with an electron sensitive resist film 40. Absorber layer 60 covers a membrane 20. FIG. 2C shows a membrane composite 10 with fiducial grid 50 on top of a thin titanium film 70, which is on top of an electron sensitive resist film 40. The electron sensitive resist film 40 covers an x-ray absorber layer 60 composed of high-atomic-number material, such as tungsten or tantalum (which can be readily etched at high resolution), which covers a membrane 20. FIG. 2D shows a cross-sectional view of a membrane composite 10 similar to that of FIG. 2C except that the absorber layer 60 is replaced by a thin film of gold 30, which serves as a base for electroplating.

Membrane composites e.g., those shown in FIGS. 2C and 2D can be produced as follows. A membrane is prepared by methods known to those skilled in the art. For example, Si-rich $Si_3N_4$ could be deposited by the commercially available process of "low-pressure chemical vapor deposition" on Si wafers polished on both front and back. The $Si_3N_4$ on the back side of the Si wafer could be removed by reactive ion etching in $CF_4$, or by immersion in hot phosphoric acid. Next, the back side of the Si wafer could be bonded by electrostatic means (so-called anodic bonding) to an optically polished Pyrex ring 50 shown in FIG. 1. The raised rim 30 or "mesa" structure on the front side can be produced by removing $Si_3N_4$ from regions at radius larger than the mesa ring and chemically etching back the thereby uncovered portion of the Si wafer in KOH. With the configuration shown in FIG. I the Pyrex ring can serve as a mask for etching the Si in KOH up to the $Si_3N_4$ membrane.

Once a free-standing $Si_3N_4$ membrane has been formed, it can be coated with a metal, such as tungsten or tantalum, to a thickness between 0.2 and 0.8 micrometers, or gold to a thickness of 10 to 30 nm. The tungsten or tantalum should be of low stress, preferably less than $1 \times 10^8$ dynes/cm$^2$, to avoid distortion of the mask membrane. The metal film can then be coated with a resist sensitive to electron beam irradiation. One such resist is polymethyl methacrylate (PMMA). In the case in which the gold plating base is used (e.g., the structure in FIG. 2D), the resist is preferably 0.2 to 1.0 micrometers thick. Resists other than PMMA can be used. If layer 60 is fabricated from tungsten or tantalum, then any of several commercially available resists containing novolak as a resin could be used, as these are resistant to the reactive ion etching process. Such resists can also be used with the electroplating process, i.e., in FIGS. 2A or 2D. SAL 601-ER7 (Shipley, Newton, Mass.) or Ray-PN (Hoescht) are suitable resists.

Figure 2A:
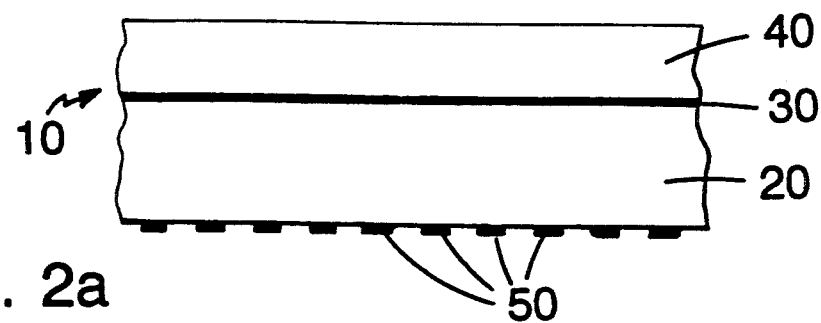
FIGS. 2A–2D is a detailed cross-sectional view of various mask membranes.
Figure 2B:
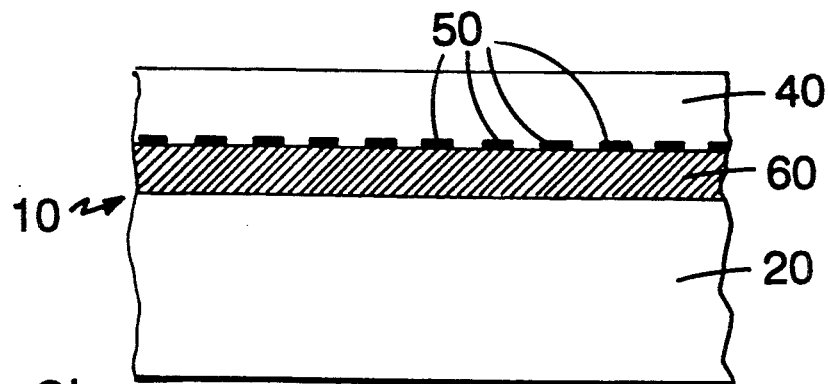
Figure 2C:
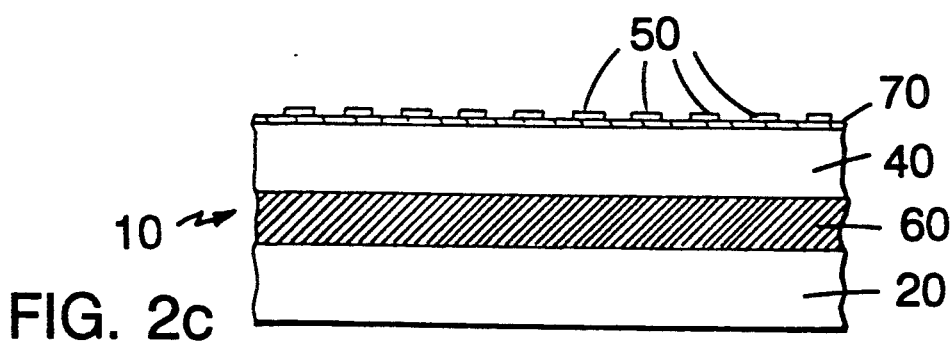
Figure 2D:
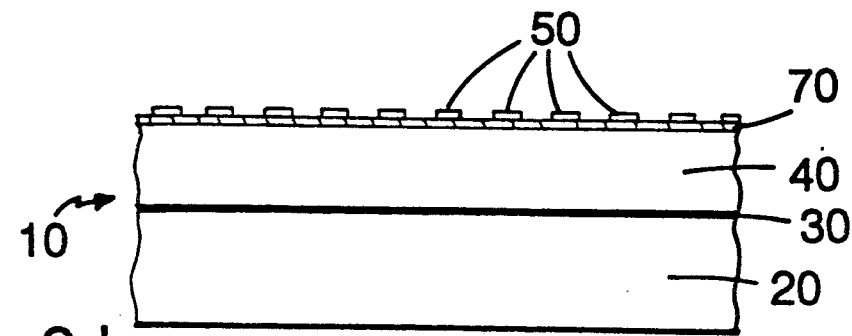
Figure 4A:
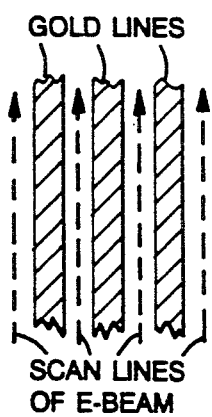
FIG. 4 is a depiction of the moiré effect arising from the interaction of the scan lines of an electron-beam and a grating.
Figure 4B:
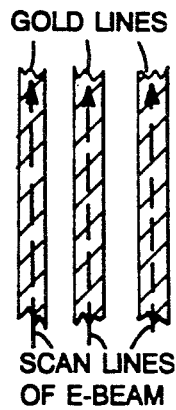
Figure 4C:
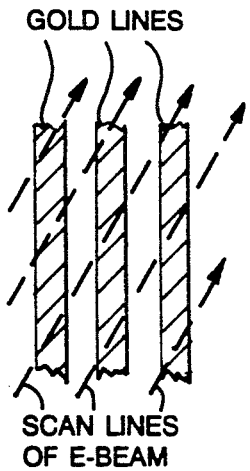
Figure 4E:
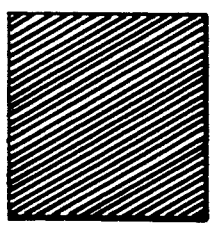
Figure 4D:
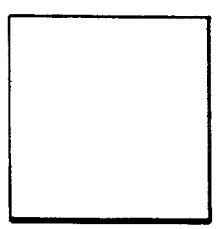
Figure 4F:
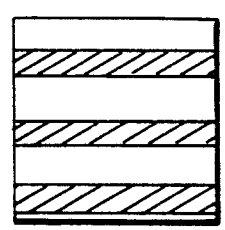

In the mask membrane composite shown in FIGS. 2C and 2D the resist film is coated with a thin (10–30 nm) film, 70, of a low atomic number metal, such as Ti or Al, or a material such as amorphous Si. The film should be sufficiently thin that it does not interfere with the writing of the pattern by the beam in the resist film. If the film is thick election, scattering therein could cause broadening of the electron beam. Moreover, the film will need to be removed prior to development of the resist. Thinness facilitates removal by chemical etching. Preferably, film 70 should also be capable of carrying away any electrical charge induced by the electron or ion beam, thereby reducing charging-induced pattern distortion. For this reason, a metal, such as Ti or Al, or a semiconductor, such as Si, is preferred. Any noninterferring "antistatic" layer that can be later removed is acceptable. If the resist itself is a conductor an antistatic layer is not needed.

Lastly, the fiducial grid 50 is applied. A preferred method of creating the fiducial grid is by holographic lithography, as is described in U.S. patent application No. 07/381,597, hereby incorporated by reference, or E. H. Anderson, Ph.D. Thesis, Massachusetts Institute of Technology, "Fabrication and Electromagnetic Applications of Periodic Nanostructures", hereby incorporated by reference. Layer 70 is coated with a photoresist sensitive to the radiation used for exposing the fiducial grid. This resist film is rather thin, preferably 10–50 nm in thickness. The thin resist film on top of layer 70 is exposed to holographic lithography preferably with the configuration chosen so that the grating produced is free of distortion, e.g., such that the period of the grating is exactly the same over the entire useful area of the substrate.

An exemplary fiducial pattern is a grid with periods $p_x$ and $p_y$ of 5 microns. Preferably, the minimum spacing of features in the fiducial pattern is less 1000 microns and more preferably it is less than 1 micron.

Figure 3:
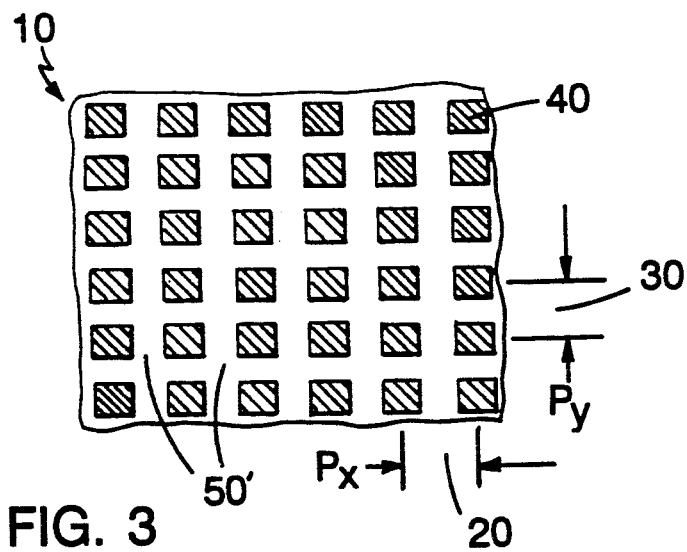
FIG. 3 is a plan view of a fiducial grid.

Holographic lithography is capable of producing gratings in which distortion is either substantially absent or exactly predictable. A grid may be produced with two holographic lithography exposures, with the second holographic lithography exposure aligned such that its grating lines run perpendicular to the first grating. These two gratings are preferably orthogonal or, at least, their angular deviation from orthogonality known precisely. A suitable grid is shown in FIG. 3, which depicts a plan view of a fiducial grid 10 with spatial periods $p_x$ 20 along the X axis and $p_y$ 30 along the Y axis, islands 40, and streets 50'. The periods $p_x$ and $p_y$ are preferably precisely defined and may be identical. Alternatively, x-ray lithography or proximity ultraviolet lithography can be used to expose the grid in the resist film on top of layer 70. The grid pattern is then preferably produced in advance on the x-ray mask or photomask, preferably by holographic lithography. The exposure of the resist on top of layer 70 preferably produces only negligible exposure in resist 40. This is easily accomplished with ultraviolet light since resist 40 is typically not sensitive to ultraviolet. Moreover, the thin film 70 largely prevents penetration of ultraviolet into film 40. Once exposed, the resist on top of layer 70 is developed to produce isolated islands of resist 40, with streets 50 running between them, as depicted in FIG. 3. The streets, 50, consist of uncovered film 70.

The fiducial grids in FIGS. 2A and 2B would likewise be produced by holographic lithography, X-ray lithography or ultraviolet lithography. In these cases, however, the grid would preferably be composed of something other than photoresist, for example a metal. The patterning of the metal would be achieved by methods known to those skilled in the art, such as liftoff or metal etching.

When an electron beam is scanned across a pattern such as that depicted in FIG. 3, the secondary electron yield of the streets and that of the islands differ, generally. This difference can be detected by secondary electron detectors, such as those typically used in scanning-electron microscope (SEM) systems. (A channel electron multiplier is a suitable device for detecting secondary electron emissions). Thus, at any given instant, as an electron beam is scanned across the grid, one can know whether the beam is located on an island or in a street. As described below, by providing information on the X, Y position of the beam, the use of the fiducial grid allows circumvention of dead reckoning in EBL.

As described below, EBL systems can be used in conjunction with a membrane composite, e.g., those depicted in FIGS. 2C or 2D to achieve a pattern writing that is free of some of the problems found in conventional EBL.

To start an EBL run, the sample containing the fiducial grid is moved, by means of the stage position controls, to a location that allows the electron beam to scan some portion of the fiducial grid. Preferably this location is "off to the side", i.e., it is outside the area where the pattern of interest will be written. Hence, considerable time can be spent in adjusting the EBL parameters, without concern for exposing the beam-sensitive resist. Preferably, the EBL system is put in a mode so that it scans an electron beam, of round or square cross section, in the pattern of a simple regular raster. At the beginning of an EBL run the following EBL parameters are typically adjusted: magnification scale in X, $M_x$; magnification scale in Y, $M_y$; orthogonality of X and Y scan directions, $\phi$; absolute starting position $(X_0, Y_0)$, and starting angular rotation, $\Theta$, of the X, Y scan field relative to the X, Y axes of the substrate fiducial grid. Once the stage is moved to a new location $(X_1, Y_1)$, the most important parameters to determine are the errors in $X_1$, $Y_1$, and $\Theta$ (i.e., $\Delta X$, $\Delta Y$, $\Delta\Theta$). However, if necessary or desired, $M_x$, $M_y$, and $\phi$ can be checked to see that they have not drifted. Many ways in which the EBL parameters can be adjusted and checked are known to those skilled in the art. A simple visual means and two means more suitable for automated computer control are described below. A key element is the precision fiducial grid, which allows circumvention of the problems of dead reckoning.

When a fiducial grid is raster scanned with an electron beam and the detected secondary electron signal used to modulate the brightness of a cathode ray tube (CRT), the CRT displays a moiré pattern representative of the difference in spatial frequency between the scan raster of the electron-beam and the fiducial grid. This phenomenon has been described in the literature (H. I.. Smith, S. R. Chinn, and P. D. DeGraff, "Application of Moiré Techniques in Scanning Electron Beam Lithography and Microscopy", J. Vac. Sci. Technol. 12, 1262-1265 (1975), and D. C. Shaver, D. C. Flanders, N. M. Ceglio, and H. I. Smith, "X-ray Zone Plates Fabricated using Electron-beam and X-ray Lithography", J. Vac. Sci. Technol. 16: 1626 (1979)), and its use in adjusting the magnification scale and eliminating deflection distortion documented. FIG. 4 depicts the moiré effect for the case of a grating of gold lines and a simple scan raster. The absolute position of a scan field relative to a fiducial grid or grating can be determined from the position (i.e., the spatial phase) of the moiré fringes.

Figure 5A:
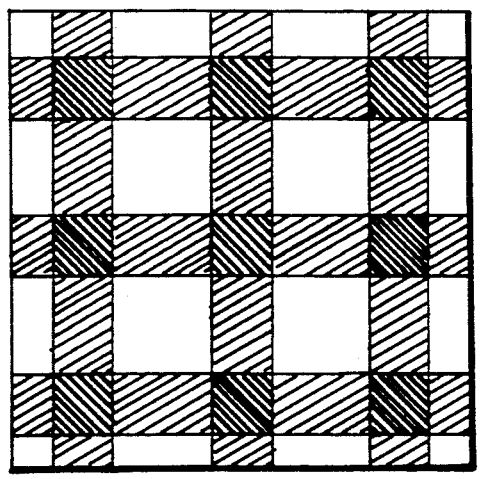
FIGS. 5A–5B is a depiction of moiré patterns generated by a raster centered on a global fiducial grid (A) and by a raster which is shifted off center by ⅛ of the period of the grid.
Figure 5B:
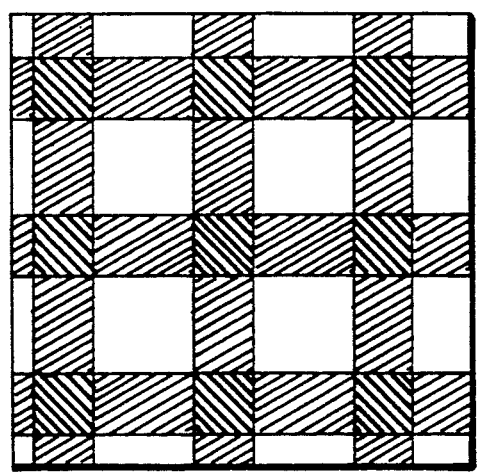

The alignment method discussed herein, in which a global fiducial grid is fixed relative to the substrate, may be understood in terms of the moiré effect. As discussed above, the moiré effect can be viewed on a CRT screen when the global fiducial grid is scanned in a raster fashion (both x and y) with the electron beam (or other beam of energy). This is depicted (for the case of a grid) in FIG. 5. If the global fiducial grid has spatial periods, $P_x$ and $P_y$, of 200 nm in a scan field measuring 200 micrometers square, there would be 1000 periods in both x and y. If the electron beam scan raster had only 997 periods across the same scan field, the moiré pattern would be similar to that shown in FIG. 5A. This moiré pattern can be referred to as one of "perfect alignment". It shows that the center of the scan raster is superimposed over a symmetry point or "a center" of the fiducial grid. If however, the scan raster is shifted to the right by only 25 nm (i.e., $p_x/8$) the moiré pattern would appear as in FIG. 5B. If the moiré pattern on the CRT displays a shift to the left by ⅛ of its period, this indicates that the raster itself has been shifted (relative to the grid) to the right by ⅛ of the period of the global fiducial grid. For example, the shift on the CRT might be 1 cm while the shift on the substrate might be 25 nm (i.e., if the fiducial grid had a period of 200 nm).

The analysis of moiré patterns generated by the interaction of the raster scans of a beam interacting with a fiducial grid is similar to the analysis of interference fringes, which has been well known to those skilled in the art for many years. It is known to those skilled in the art that interference fringe shifts of 1/10 the fringe spacing can be detected with ease. With modern interferometers, in which the fringe pattern is detected by a charge-coupled device (CCD) array and the information contained in the fringe pattern is analyzed in the electronic "time domain" by means of a computer, interference fringe shifts of 1% of the fringe spacings are detectable. The same principles apply to the interpretation of moiré fringes, i.e., it is expected to be possible to detect fringe shifts of 1/10 the spacing with ease and, with appropriate computer algorithms, it is possible to detect shifts of 1% of moiré fringe spacing. With a fiducial grid having a spatial period of less than 1 micrometer, scan field misalignments of 10 nm to 100 nm are detectable. Using existing holographic systems, grid periods of 200 nm are easily achieved. Such a fiducial grid allows alignment of scan fields to within 2 to 20 nm.

A single rapid scan of the fiducial grid pattern is sufficient to produce a moiré pattern that gives precise information on the position and orientation of the scan field, and such a scan can be conducted so that the dose delivered to the substrate is not sufficient to fully expose an electron sensitive resist layer. Once the single scan is made the beam is turned off, so call "beam blanking". If the position and orientation of the EBL scan field, as determined from the moiré pattern (which may be viewed for example on a storage CRT), are different than desired a correction signal can be applied to the beam deflection system that brings the scan field into alignment with the fiducial grid pattern.

A second method whereby EBL parameters can be adjusted and checked using a global fiducial grid pattern is suitable for automated computer control. When the scanning of the electron beam over the fiducial grid is done under computer control, an oscillator or "clock" puts out a sequence of pulses of well defined frequency. These pulses increment a D/A converter which puts out a voltage ramp in the form of a staircase. This ramp, in turn, is put into the beam deflection drivers. Each step of the staircase voltage ramp has a number associated with it. For example, with a 14-bit D/A converter there are $2^{14}$ (i.e., 16,384) steps, each having a number between zero and 16,384 associated with it. After each full ramp of the X staircase, a staircase ramp assigned to Y is incremented by one or more steps. Thus, each point in the scan field has a (X, Y) digital address associated with it. The roles of X and Y can be easily interchanged in order to produce an orthogonally oriented scan raster. In modern EBL systems one has considerable flexibility in producing a grid scan field. For example, one could alternate, scanning one line in the X direction, then one in the Y direction, and so forth. One can make innumerable variations on the sequence of steps used to scan the grid.

As the beam scans across the fiducial grid, the emitted secondary electrons are picked up by a secondary electron detector. The output of the secondary electron detector is an oscillatory signal, increasing or decreasing each time the beam crosses a street. From the pattern of oscillations due to street crossings one can easily tell if the X scan is parallel to the X axis of the fiducial grid, and similarly for the Y scan. If not parallel, the scan field can be rotated using techniques known to those skilled in the art. This angular adjustment, $\Theta$, is preferably made first. Since the fiducial grid is orthogonal, this same analysis of the street crossing pattern can be used to set the X and Y scans orthogonal to one another, that is, setting $\phi$ equal to 90°. The angle $\phi$ is preferably set exactly to 90°, so that X and Y scan directions are orthogonal. This corresponds to the situation in a visual moiré display where the moiré pattern for a Y-oriented scan raster is a 90° rotated version of the moiré pattern for an X-oriented scan raster. Comparing the frequency of the clock to the frequency of street crossings and setting this frequency difference between the clock and the street crossings to a definite value is equivalent to setting $M_x$ or $M_y$.

The phase difference between the clock and the oscillatory signal resulting from the street crossings varies as a function of address over the scan field. A point at which the two oscillatory signals both have a given phase can be defined as the position $(X_0, Y_0)$ From a knowledge of the periods of the fiducial grid (i.e., $p_x$ and $p_y$) one can easily determined the phase differences that should exist at a new desired position $(X_1, Y_1)$ of the scan field. If the stage is directed to a new position $(X_1, Y_1)$, and the new position is not achieved, the positional error will be reflected in the phase difference between the two signals. The entire scan field can then be electromagnetically deflected to correct for the position error. In moving to a new desired position $X_1, Y_1$, the stage motion precision is preferably such that the desired position is achieved to within less than $p_x/2$ in X and less that $p_y/2$ in Y, otherwise the method described herein may not properly correct position error. Likewise, the unpredictable drift of the scan field due to charging or other causes must be less than $p_x/2$ in X and $p_y/2$ in Y. This necessity of arriving at $X_1, Y_1$, to within $p_x/2$ and $p_y/2$ is clear in the moiré display of FIG. 5.

Once the EBL parameters are adjusted and set in a region "off to the side," the electron beam is deflected to a beam stop (sometimes called beam blanking) and the stage moved to the next desired location, e.g., an area where a pattern of interest is to be written. A single scan of the fiducial grid is made at a dose insufficient to fully expose the beam-sensitive resist and the data on street crossings stored on computer. While the electron beam is blanked, this data is analyzed for information on $X_1, y_1$, and $\Theta$. Because the fiducial mark is a periodic grid, and hence the data is in the form of a periodic or quasi-periodic signal, a variety of well known signal enhancement techniques, such as lock-in amplifiers, can be employed. Generally, it is permissible to expose the resist 1 to 10% of its fully exposed dose without subsequent deleterious effect on the desired pattern. If errors in $X_1, Y_1$ or $\Theta$ are found, correction signals can then be sent to the beam deflection system, bringing the scan field into proper registry with the fiducial grid. This process is then repeated for other locations on the sample.

Figure 6A:
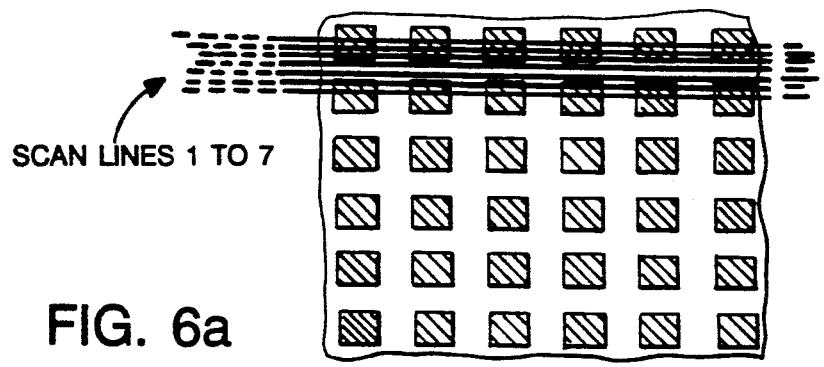
FIG. 6A is a representation of scan lines superimposed on a fiducial grid.
Figure 6B:
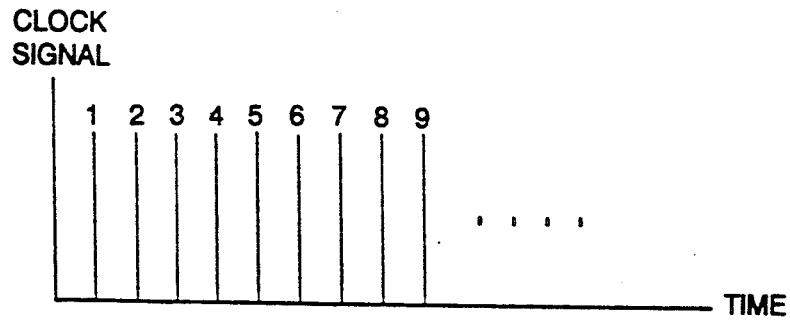
FIG. 6B is a comparison of clock signals and the detected signals that result when a fiducial grid is scanned under the control of the clock signals.
Figure 6C:
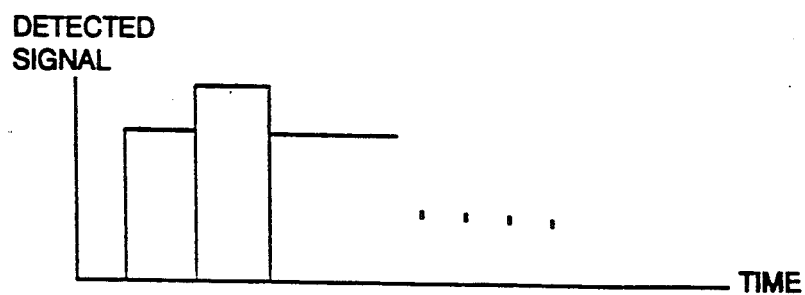

A third method of analyzing and correcting EBL parameters is based not on the master clock and the interaction of the beam with streets that are orthogonal to the direction of scanning, but rather one in which the clock increments by one each time an X scan is completed. The master clock is often run at megahertz frequency whereas a clock that increments each time an X scan is complete typically runs 100 to 60,000 times slower. Commonly, a "blanking pulse" is emitted at the end of an X scan. This pulse is a signal for the electron beam to be turned off while returning to the starting X position. This series of blanking pulses could be used instead of increments of the master clock. Alternatively, any subharmonic of the master clock can be used. The signal from the fiducial grid would likewise be oscillatory as the beam alternated between running lengthwise along streets and crossing islands. This is depicted in FIG. 6A which depicts the beam scan lines superimposed on the fiducial grid and FIG. 6B which compares a clock signal with a detected signal.

In this third method, the relative phase of the clock signal and the detected signal is a measure of $\Theta$. If $\Theta$ is zero for both X-oriented and Y-oriented raster scans then X and Y are orthogonal. Once $\Theta$ and $\phi$ are fixed, $M_x$ and $M_y$ can be adjusted. $M_y$ is proportional to the difference in frequency between the clock and the detected signal for the X-directed scan raster, and $M_x$ is proportional to the difference in frequency between clock and detected signal for a Y-directed scan raster. Spatial position (i.e., $X_0, Y_0$ or, $X_1, Y_1$, etc.) is related to difference in phase between the clock signal and the detected signal. For example, $X_0, Y_0$ can be taken to be the phase difference between the two signals at the center of the digital address field. That is, at an address corresponding to the center of the digital scan field, there will be a definite phase difference between the clock signal and the detected signal for an X-directed scan, and a definite value of phase difference for a Y directed scan. (This concept is displayed in spatial form in the moiré pattern of FIG. 5.) We could change these phase differences and set them to zero if we wished by either physically moving the stage or electromagnetically shifting the scan raster, just as we can shift the spatial phase of the moiré pattern. When one is working under computer control there is no need to do so; the computer could just as easily designate $X_0, Y_0$, as corresponding to the aforementioned phase differences rather than zero phase difference.

As in the other two methods, a new desired position X, Y, is preferably achieved to within $p_x/2$ in X and $p_y/2$ in Y.

Other embodiments are within the following claims e.g., the methods described herein can be used with membrane composites of various configurations, e.g., those depicted in FIG. 2A, in which the electron beam penetrates through the membrane in order to encounter the fiducial grid.

The methods described herein can also be used in conjunction with beams of other forms of radiant energy, e.g., they can be used in focused ion-beam lithography (FIBL). FIBL is described in W. Chu, A. Yen, K. Ismail, M. I. Shepard, H. J. Lezec, C. R. Musil, J. Melngailis, Y. C. Ku, J. M. Carter, and H. I. Smith, "Sub-100 nm X-ray Mask Technology using Focused-Ion-Beam Lithography", J. Vac. Sci. Technol. B 7, 1583-1585 (1989), hereby incorporated by reference. As described therein, FIBL has many advantages over EBL, particularly because of the near absence of backscattering and the resulting deleterious proximity effects. The FIBL technique is similar to EBL except that the ions do not penetrate substrates as readily as electrons, and hence the membrane composites analogous to those depicted in FIG. 2C or 2D are preferably used.

Figure 7:
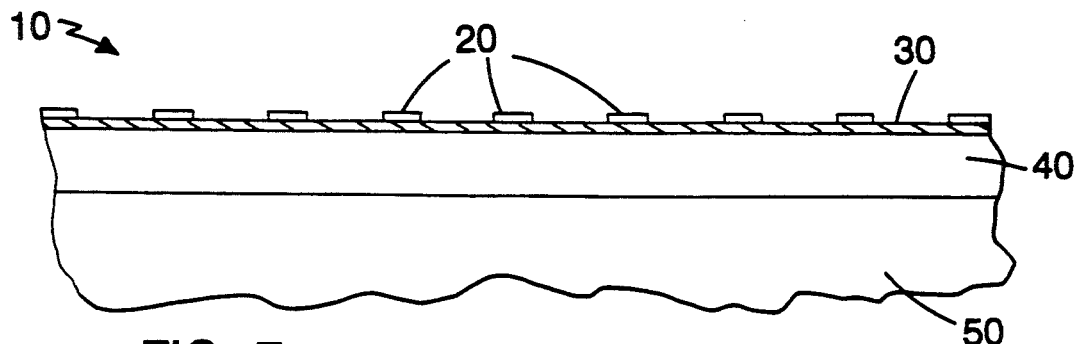
FIG. 7 is a cross-sectional view of a thick substrate suitable for fiducial reference EBL.

The methods described herein that use membrane composites of the type depicted in FIGS. 2B, 2C and 2D can be used in conjunction with a substrate other than a membrane, i.e., they can be used with a thick substrate. An example of a thick substrate which can be used in conjunction with the invention is depicted in FIG. 7. As shown in FIG. 7, thick substrate composite 10 includes fiducial grid 20, conducting layer 30, beam sensitive resist 40, and thick substrate 50.

Figure 8A:
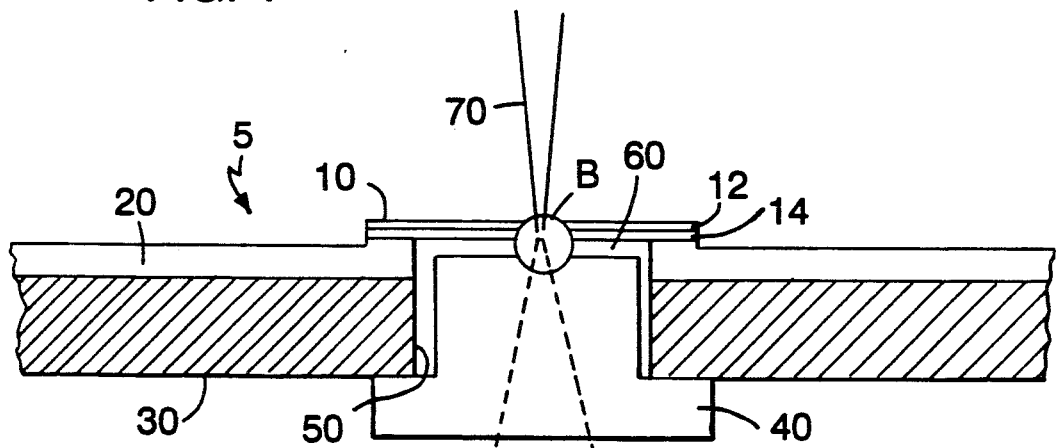
FIGS. 8A–8B is a depiction of an alternative method of generating a signal corresponding to the interaction of a beam with a fiducial grid.
Figure 8B:
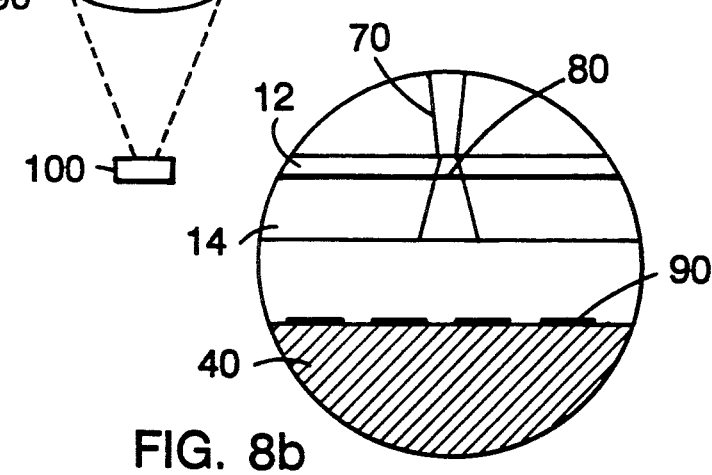

In embodiments described above secondary electrons emitted from the fiducial grid generate a signal representing the interaction of the beam with the fiducial grid. The signal representative of the beam location on the fiducial grid could also be generated by backscattered electrons, emitted photons, or any signal which changes as the beam moves from island to street. FIG. 8A depicts a cross-sectional view of membrane assembly 5, which uses photons rather than secondary electrons to determine the position of a beam. FIG. 8B is a detailed cross-sectional view of the portion of FIG. 8A labeled "B". Assembly 5 includes a resist coated mask membrane 10 (which includes resist coating 12 and membrane 14) mounted on layer 20, typically a Si wafer, bonded to the surface of mask frame 30. Reference insert 40 is positioned in frame aperture 50, forming gap 60. Reference insert 40 is made, using standard methods known to those skilled in the art, such that when it is inserted into the frame aperture 50, the resulting gap (gap 60) is very precisely formed and is preferably about 5 $\mu$m in thickness. Alternatively, rigidly mounted micromechanical actuators could be used to manipulate the reference insert and position it such that a small and precise gap is formed.

Reference insert 40 is fabricated from a low-thermal-expansion glass such as Zerodur, and is polished to an optical flat. As shown in FIG. 8B the fiducial grid 90 is formed on the surface of the reference insert. The fiducial grid is made of a material that blocks light e.g., 30 nm of chromium. When the beam 70, e.g. an electron or ion beam, travels through the resist coating 12 and membrane 14 a small spot 80 of optical light is generated by the process known as cathodoluminescence. This spot 80 is on the order of 100 nm, or less, in size. A lens 90 and detector 100 are situated below the mask membrane to collect the light 110 from the spot 80. As the beam scans across the mask, the fiducial grid alternatively blocks or allows light 110 to pass to the detector. The gap between membrane and fiducial insert, the period of the fiducial grid, and the numerical aperture of the lens are adjusted such that the blocking action is maximized. In order to correct the measured beam position for the effects of parallax, which occur when the electron beam is significantly distant from the optical axis of the lens and detector, the position of the beam needs to be roughly known. Because the beam position error due to parallax is a very weak function, the beam position needs only be known within 10-100 $\mu$m in order to reduce the error in the beam position to be below 10 nm (for a 200 nm period fiducial grid and a gap of 5 $\mu$m).

If the period of the fiducial grid is required to be of such a small size that diffraction of the luminescent light through the grid causes excessive blurring, which results in non-detection of the position of the electron beam an alternate method can be used. Instead of using a fiducial grid made of a substance such as chromium which blocks the cathodoluminescent light, the fiducial grid could be made of material that is both transparent to light and which fluoresces when it is struck by high energy particles. Such materials are known to those skilled in the art. As the electron or ion beam travels through the mask it spreads slightly due to scattering from atoms. However, if the beam is high enough in voltage, this spreading can be small (below 10 nm). (For ion beams scattering in negligible.) As the spread beam exits the membrane from below, it travels across the gap and causes the material in the fiducial grid to fluoresce. If the gap is sufficiently small and the period of the fiducial grid properly selected, only an area of the fiducial grid directly below the spot of the beam and comparable in size to the grid line width will be caused to brightly fluoresce. As the scanning beam moves over the mask, the lines of the grid will alternatively fluoresce brightly and then dim, allowing detection of the beam position. The fluoresced light can be detected by a large optical detector, such as a photomultiplier tube. There is no parallax effect with this method.

Because the reference insert is highly rigid and not susceptible to distortion due to thermal variations, it can be removed and the fiducial grid inspected and mapped by holographic or other means. Thus, the fidelity of the reference grid can be determined and recorded without subsequent mechanical or thermal distortion. Alternatively, if such mapping of the fiducial grid reveals distortions, these distortions can be recorded in computer memory, and this data retrieved by the electron or ion beam writing tool during mask patterning in order to remove the effects of the known distortions in the fiducial grid. Thus distortion-free mask patterns can be written even though the fiducial grid is not perfectly distortion-free.

What is claimed is:

1. A method of monitoring the travel of a beam of energy on a substrate having a fiducial pattern rigidly fixed relative to said substrate, said pattern embracing an area where said beam can create a useful image with submicron precision, comprising adjusting said beam such that the dose delivered by said beam is sufficiently high to generate a signal produced by the interaction of said beam and said fiducial pattern, said signal being representative of the relative position of said fiducial pattern and said travel, said dose being sufficiently low so that the area of said substrate over which said beam passes remains receptive to subsequent creation, with submicron precision, of a useful image, moving said beam across said substrate, detecting said signal produced by the interaction of said beam with said fiducial pattern, and comparing said detected signal with a predetermined signal to provide a position signal representative of the beam travel with submicron precision.

2. The method of claim 1, wherein said signal is representative of the relative orientation of said fiducial pattern and said travel.

3. The method of claim further comprising creating said useful image with said beam.

4. The method of claim 1, wherein said useful image includes a submicron feature.

5. The method of claim 3, wherein said useful image is created with submicron precision.

6. The method of claim 1, wherein said comparison occurs prior to creating a first useful image representative of areas of impingement of said beam on said substrate.

7. The method of claim 1, wherein said comparison occurs after creating a first useful image representative of areas of impingement of said beam on said substrate.

8. The method of claim 1, wherein said comparison occurs after creating a first image representative of areas of impingement of said beam and before creating a second image representative of areas of impingement of said beam.

9. The method of claim 1, further comprising the step of controlling the travel of said beam of energy on said substrate in response to said position signal.

10. The method of claim 9, wherein said controlling occurs prior to creating a first useful image representative of areas of impingement of said beam on said substrate.

11. The method of claim 9, wherein said controlling occurs after creating a first useful image representative of areas of impingement of said beam on said substrate.

12. The method of claim 1, further comprising the step of holographically producing said fiducial pattern.

13. The method of claim wherein said predetermined signal is a periodic signal.

14. The method of claim 1, wherein said predetermined signal is a quasiperiodic signal.

15. The method of claim 1, wherein the beam travel characterizes a scan field, defined by orthogonal X and Y axes and said fiducial pattern is characterized by X and Y orthogonal axes, said position signal is representative of $\Theta$, which represents the angular rotation of the X, Y axes of the scan field of said beam relative to the X, Y axes of said fiducial pattern.

16. The method of claim wherein said position signal is representative of $\phi$, which represents the orthogonality of the X and Y axes of the scan field of said beam.

17. The method of claim 1, wherein said position signal is representative of $M_x$, which is the magnification in an X direction.

18. The method of claim 1, wherein said position signal is representative of $M_y$, which is the magnification in a Y direction.

19. The method of claim 1, wherein said position signal is representative of $X_0$, which is a first position of said beam in an X direction.

20. The method of claim wherein said position signal is representative of $X_1$, which is a second position of said beam in an X direction.

21. The method of claim wherein said position signal is representative of $Y_0$ which is a first position of said beam in a Y direction.

22. The method of claim wherein said position signal is representative of $Y_1$, which is a second position of said beam in a Y direction.

23. The method of claim wherein said beam comprises an electron beam and said substrate comprises an electron sensitive layer.

24. The method of claim 1, wherein said beam comprises an ion beam and said substrate comprises an ion sensitive layer.

25. A method of monitoring the travel of a beam of energy on a substrate having a fiducial pattern rigidly fixed relative to said substrate, said pattern embracing an area where said beam can write a useful image with submicron precision, comprising moving said beam across said substrate to create said image, detecting a signal produced by the interaction of said beam with said fiducial pattern while said beam is creating said useful image, said signal being representative of the relative position of said fiducial pattern and said travel, and comparing said detected signal with a predetermined signal to provide a position signal representative of the beam travel with submicron precision.

26. The method of claim 25, wherein said signal is representative of the relative orientation of said fiducial pattern and said travel.

27. The method of claim 25, wherein said useful image includes a submicron feature.

28. The method of claim 25, wherein said useful image is created with submicron precision.

29. The method of claim 25, wherein said comparison is performed while said beam is creating said useful image.

30. The method of claim 25, further comprising the step of controlling the travel of said beam of energy on said substrate in response to said position signal.

31. The method of claim 30, wherein said controlling is performed while said beam is writing said useful image.

32. The method of claim 25, further comprising the step of holographically producing said fiducial pattern.

33. The method of claim 25, wherein said predetermined signal is a periodic signal.

34. The method of claim 25, wherein said predetermined signal is a quasiperiodic signal.

35. The method of claim 25, wherein the beam travel characterizes a scan field, defined by orthogonal X and Y axes and said fiducial pattern is characterized by X and Y orthogonal axes, said position signal is representative of $\Theta$, which represents the angular rotation of the X, Y axes of the scan field of said beam relative to the X, Y axes of said fiducial pattern.

36. The method of claim 25, wherein said position signal is representative of $\phi$, which represents the orthogonality of the X and Y axes of the scan field of said beam.

37. The method of claim 25, wherein said position signal is representative of $M_x$, which is the magnification in an X direction.

38. The method of claim 25, wherein said position signal is representative of $M_y$, which is the magnification in a Y direction.

39. The method of claim 25, wherein said position signal is representative of $X_0$, which is a first position of said beam in an X direction.

40. The method of claim 25, wherein said position signal is representative of $X_1$, which is a second position of said beam in an X direction.

41. The method of claim 25, wherein said position signal is representative of $Y_0$ which is a first position of said beam in a Y direction.

42. The method of claim 25, wherein said position signal is representative of $Y_1$, which is a second position of said beam in a Y direction.

43. The method of claim 25, wherein said beam comprises an electron beam and said substrate includes an electron sensitive layer.

44. The method of claim 25, wherein said beam comprises an ion beam and said substrate comprises an ion sensitive layer.

45. A substrate for establishing a useful image representative of the path traversed by a beam of energy in a region of said substrate, said substrate responsive to impingement of said beam of energy, comprising a fiducial pattern fixed with reference to said region of said substrate, located in the region of said substrate where said useful image is created, comprising indices representative of beam travel, and characterized by producing a detectable position signal representative of the travel of said beam on said substrate with submicron precision.

46. The substrate of claim 45, wherein said fiducial pattern embraces a portion of said substrate that lies between a first region of said substrate in which a useful image is to be established and a second region of said substrate in which a useful image is to be established.

47. The substrate of claim 45, wherein said substrate comprises a film sensitive to the impingement of an electron-beam.

48. The substrate of claim 45, wherein said substrate comprises a film sensitive to the impingement of a photon-beam.

49. The substrate of claim 45, wherein said substrate comprises a film sensitive to the impingement of an ion-beam.

50. The substrate of claim 45, wherein said indices are distributed in a regular array.

* * * * *

UNITED STATES PATENT AND TRADEMARK OFFICE
CERTIFICATE OF CORRECTION

PATENT NO.   : 5,136,169

DATED        : August 4, 1992

INVENTOR(S)  : Henry I. Smith et al.

It is certified that error appears in the above-identified patent and that said Letters Patent is hereby corrected as shown below:

```
Column 3, line 45, "φ" should read --ϕ--.
Column 4, line 31, "φ" should read --ϕ--.
Column 4, line 32, "X₀, x₁," should read --X₀, X₁,--.
Column 5, line 17, "φ" should read --ϕ--.
Column 6, line 31, "FIG." should read --FIG. 1,--.
Column 7, line 35, "FIG. I" should read --FIG 1--.
Column 9, line 26, "φ" should read --ϕ--.
Column 9, line 32, "φ" should read --ϕ--.
Column 11, line 22 (both occurrences), "φ" should read --ϕ--.
Column 12, line 30, "φ" should read --ϕ--.
Column 15, line 1, claim 3, after "claim" insert --1,--.
Column 15, line 31, claim 13, after "claim" insert --1,--.
Column 15, line 42, claim 16, after "claim" insert --1,--.
Column 15, line 43, claim 16, "φ" should read --ϕ--.
Column 15, line 54, claim 20, after "claim" insert --1,--.
Column 15, line 57, claim 21, after "claim" insert --1,--.
Column 15, line 60, claim 22, after "claim" insert --1,--.
Column 15, line 63, claim 23, after "claim" insert --1,--.
Column 16, line 47, claim 36, "φ" should read --ϕ--.
```

Signed and Sealed this

Twelfth Day of October, 1993

Attest:

Attesting Officer

BRUCE LEHMAN

Commissioner of Patents and Trademarks